(12) United States Patent
Cheng et al.

(10) Patent No.: US 12,114,420 B2
(45) Date of Patent: Oct. 8, 2024

(54) DISPLAY MODULE HAVING POLYGON SHAPED FLEXIBLE CIRCUIT BOARD

(71) Applicant: Dell Products L.P., Round Rock, TX (US)

(72) Inventors: Tsung-Chin Cheng, Taoyuan (TW); Chin-Chung Wu, Yonghe District (TW); Hong-Ji Huang, Xinyi District (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/889,092

(22) Filed: Aug. 16, 2022

(65) Prior Publication Data

US 2024/0023228 A1    Jan. 18, 2024

Related U.S. Application Data

(63) Continuation-in-part of application No. 17/867,462, filed on Jul. 18, 2022.

(51) Int. Cl.
| | |
|---|---|
| *H05K 1/02* | (2006.01) |
| *G02F 1/133* | (2006.01) |
| *G02F 1/1333* | (2006.01) |
| *G02F 1/1345* | (2006.01) |
| *H05K 1/14* | (2006.01) |
| *H05K 9/00* | (2006.01) |

(52) U.S. Cl.
CPC ......... *H05K 1/023* (2013.01); *G02F 1/13306* (2013.01); *G02F 1/133334* (2021.01); *G02F 1/13452* (2013.01); *H05K 1/14* (2013.01); *H05K 9/0024* (2013.01); *G02F 1/133302* (2021.01); *G09G 2330/06* (2013.01); *H05K 2201/09027* (2013.01); *H05K 2201/10136* (2013.01)

(58) Field of Classification Search
CPC ....................... G02F 1/133334; G02F 1/13452
See application file for complete search history.

(56) References Cited

U.S. PATENT DOCUMENTS

| | | | |
|---|---|---|---|
| 10,185,361 B2 | 1/2019 | Schwager et al. | |
| 2014/0218322 A1* | 8/2014 | Chung | G06F 3/0446 345/173 |

(Continued)

FOREIGN PATENT DOCUMENTS

| | | | | |
|---|---|---|---|---|
| CN | 101312003 B | * | 8/2012 | ........... G09G 3/3611 |
| JP | 10268793 A | * | 10/1998 | ......... G02F 1/13452 |

*Primary Examiner* — Alexander P Gross

(74) *Attorney, Agent, or Firm* — Larson Newman, LLP

(57) ABSTRACT

An LCD display module includes a polygon flexible printed circuit to produce a thinner display. The polygon flexible printed circuit connects a driver integrated circuit to a printed circuit board assembly and a glass substrate. The polygon flexible printed circuit has a narrow minor end connected to the glass substrate and a wider major end connected to the printed circuit board assembly. Because the polygon flexible printed circuit has different end widths, the polygon flexible printed circuit permits reduced spacing of electronic components in proximity of the narrower minor end. The LCD display module also includes a shielding can in physical communication with the printed circuit board assembly to reduce electromagnetic interference between the printed circuit board and the polygon flexible printed circuit.

20 Claims, 8 Drawing Sheets

(56) References Cited

U.S. PATENT DOCUMENTS

2016/0324027 A1* 11/2016 Ahn ................. H05K 1/147
2017/0094779 A1* 3/2017 Go ................. H05K 1/0201
2018/0210489 A1 7/2018 Boisard et al.

* cited by examiner

DISPLAY MODULE HAVING POLYGON SHAPED FLEXIBLE CIRCUIT BOARD

CROSS REFERENCE TO RELATED APPLICATIONS

This application is a Continuation-in-part of U.S. patent application Ser. No. 17/867,462 entitled "DISPLAY MODULE HAVING GRADIENT SHAPED FLEXIBLE CIRCUIT BOARD" filed Jul. 27, 2022, the disclosure of which is hereby expressly incorporated by reference in its entirety.

FIELD OF THE DISCLOSURE

This disclosure generally relates to information handling systems, and more particularly relates to LCD/LED display modules.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An LCD display module implements a polygon flexible printed circuit to produce a thinner design. The polygon flexible printed circuit connects a driver integrated circuit between a printed circuit board assembly and a glass substrate. The polygon flexible printed circuit has a narrow minor end connected to the glass substrate and a wider major end connected to the printed circuit board assembly. Because the polygon flexible printed circuit has different end widths, the polygon flexible printed circuit permits reduced spacing of electronic components in proximity of the narrower minor end. The LCD display module also includes a shielding can in physical communication with the printed circuit board assembly to reduce electromagnetic interference between the printed circuit board and the polygon flexible printed circuit. Signaling between the electronic components is improved. The polygon flexible printed circuit also has a smaller dimensional stack, thus allowing for a larger display viewing area and a thinner display module.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
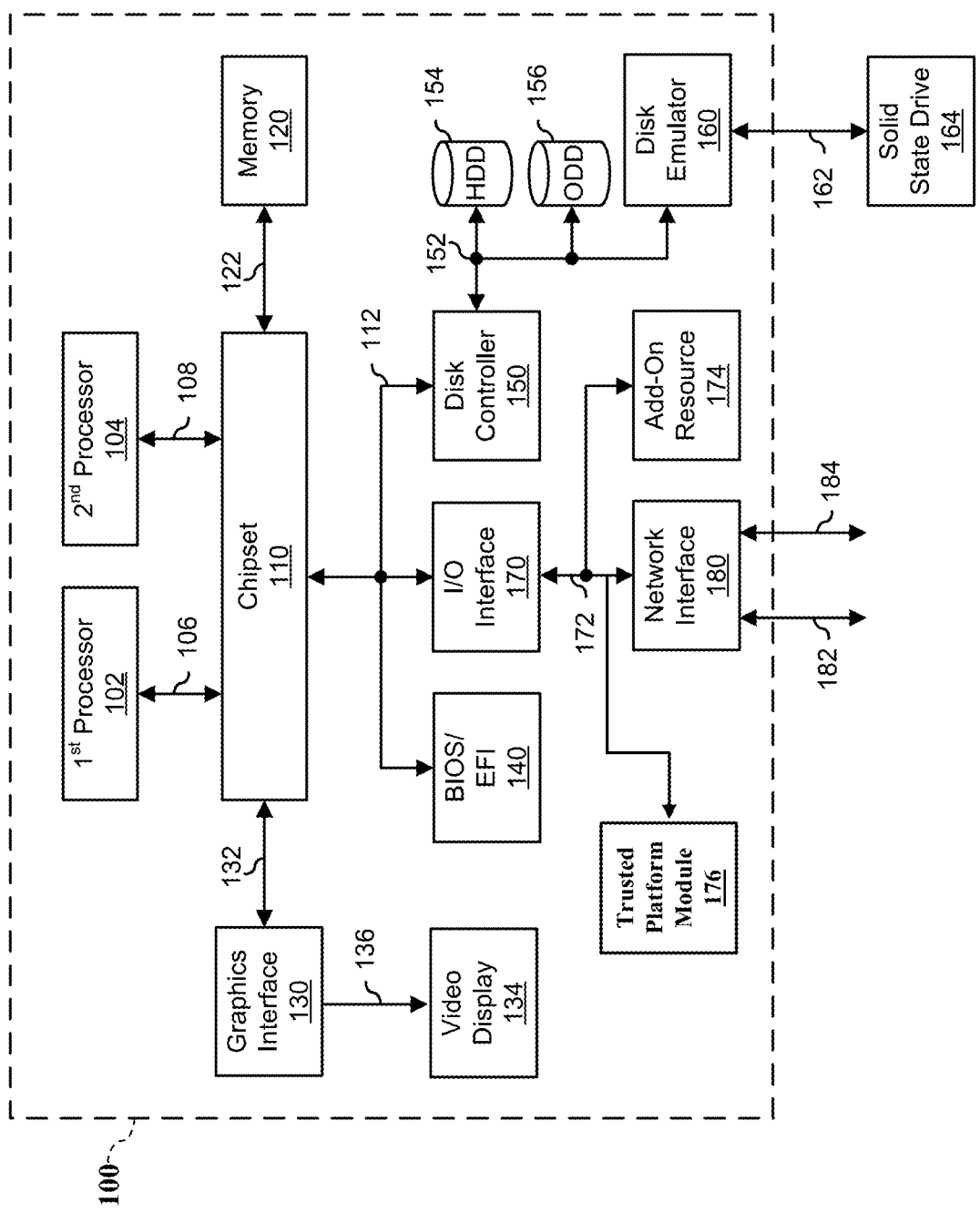
FIG. 1 illustrates an information handling system incorporating an intelligent imaging device, according to exemplary embodiments.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, and a network interface device 180. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

The information handling system 100 may include a baseboard management controller (BMC). The BMC is connected to multiple elements of information handling system 100 via one or more management interface to provide out of band monitoring, maintenance, and control of the elements of the information handling system. As such, BMC represents a processing device different from processors 102 and 104, which provides various management functions for information handling system 100. In an embodiment, BMC may be responsible for granting access to a remote management system that may establish control of the elements to implement power management, cooling management, storage management, and the like. The BMC may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface that may include an inter-integrated circuit (I²C) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC includes a network interface that can be connected to a remote management system to receive firmware updates, as needed or desired. Here BMC receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC utilizes various protocols and application programming interfaces (APIs) to direct and control the processes for monitoring and maintaining the system firmware. An example of a protocol or API for monitoring and maintaining the system firmware includes a graphical user interface (GUI) associated with BMC, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RACADM) utility, Dell EMC Open Manage Server Administrator (OMSS) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC is included on a main circuit board (such as a baseboard, a motherboard, or any combination thereof) of information handling system 100, or is integrated into another element of the information handling system such as chipset 110, or another suitable element, as needed or desired. As such, BMC can be part of an integrated circuit or a chip set within information handling system 100. BMC may operate on a separate power plane from other resources in information handling system 100. Thus BMC can communicate with the remote management system via network interface or the BMC can communicate with the external mobile device using its own transceiver circuitry while the resources or elements of information handling system 100 are powered off or at least in low power mode. Here, information can be sent from the remote management system or external mobile device to BMC and the information can be stored in a RAM or NV-RAM associated with the BMC. Information stored in the RAM may be lost after power-down of the power plane for BMC, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Figure 2:
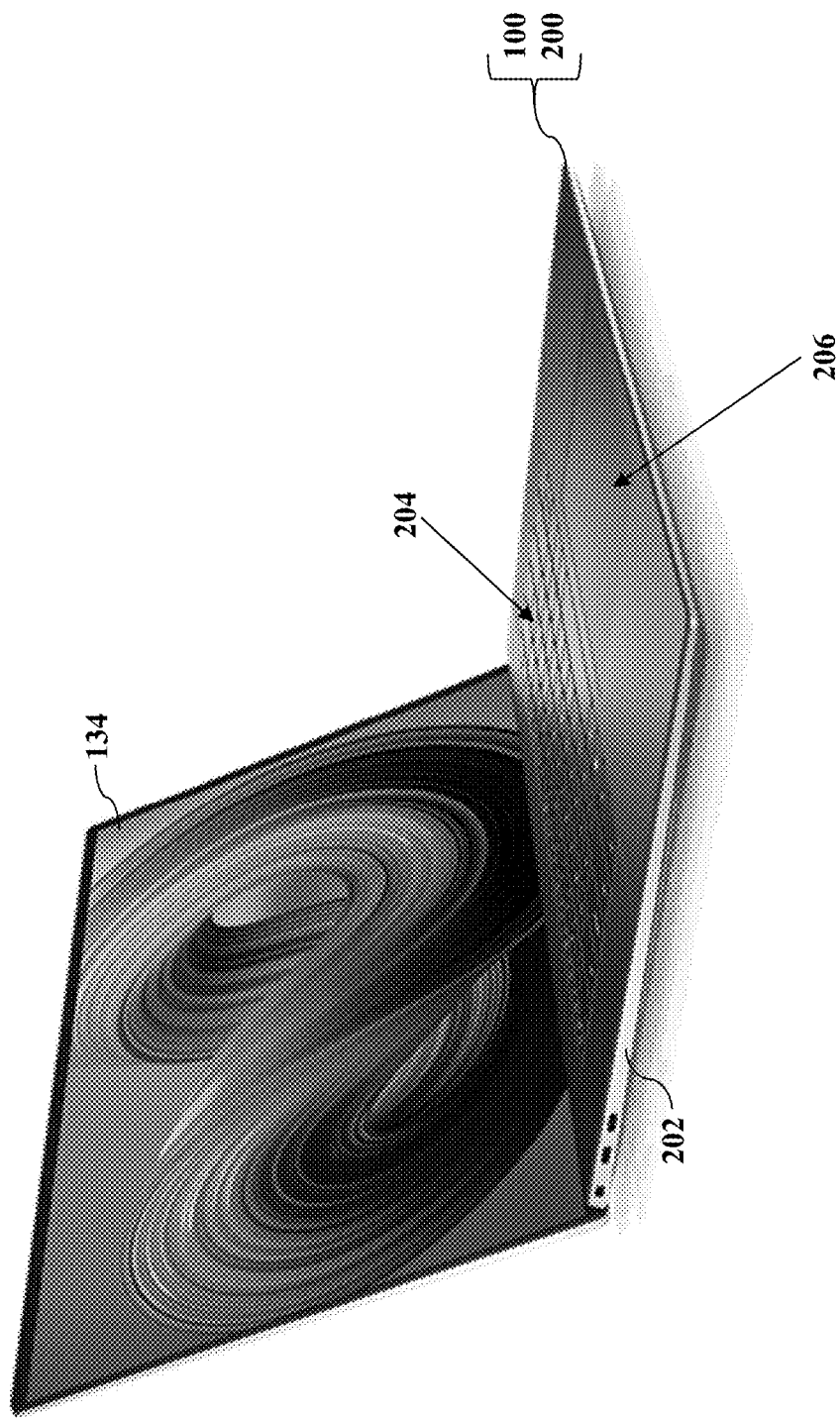
FIG. 2 further illustrates the information handling system, according to exemplary embodiments.

FIG. 2 shows the information handling system 100 as a mobile laptop computer 200 having an outer enclosure 202, a keyboard 204, a touchpad 206, and the display 134.

Figure 3:
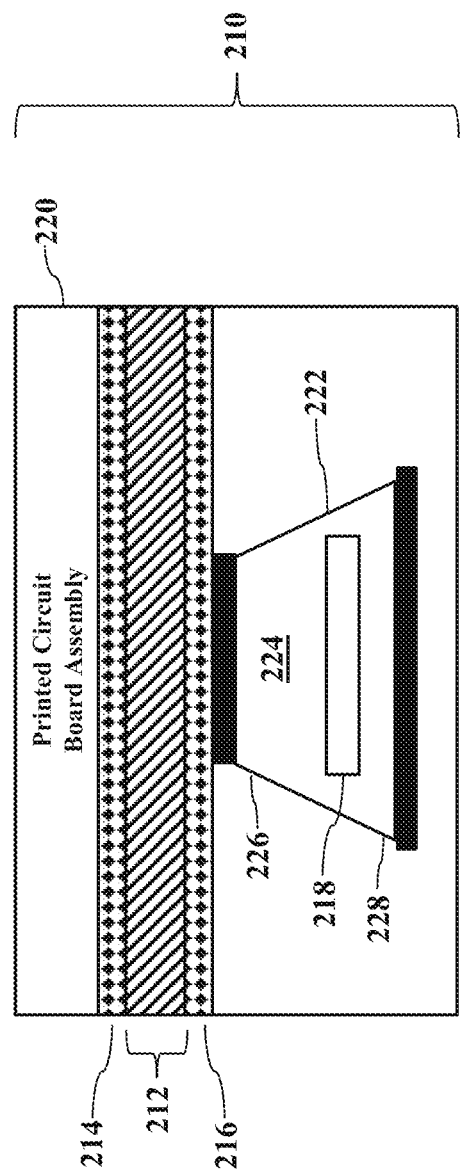
FIG. 3 is a simplified illustration of a display, according to exemplary embodiments.
Figure 4:
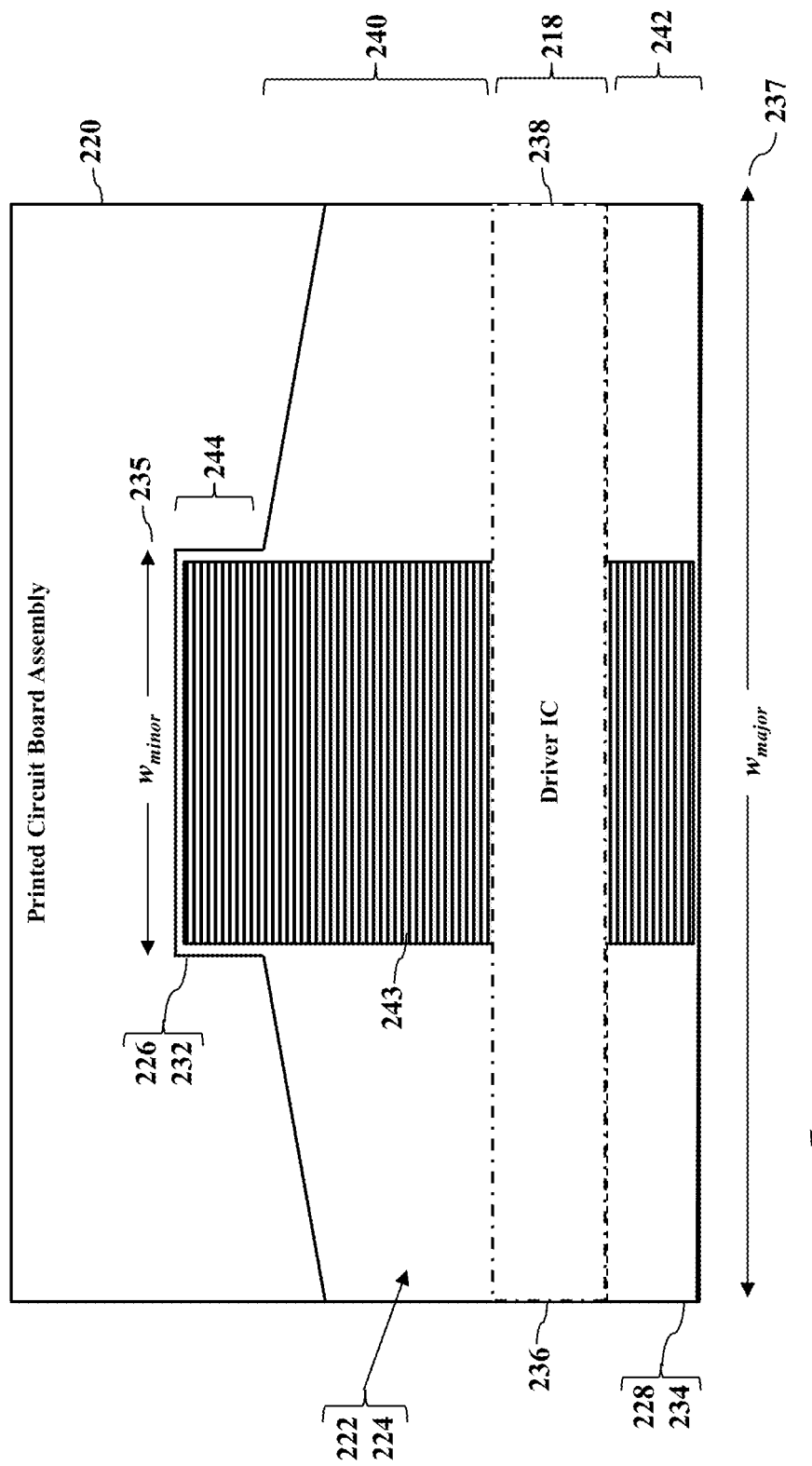
FIG. 4 is an enlarged view of a gradient flexible printed circuit, according to exemplary embodiments.

FIGS. 3 and 4 show the display 134 according to exemplary embodiments. The display 134 visually presents output information in pictorial, textual, and/or graphical form. While the display 134 may have construction or operating principle (such as LED or OLED), most readers are thought familiar with a liquid crystal display technology. FIG. 3 thus illustrates the display 134 as a liquid crystal display (or "LCD") module 210 having a liquid crystal material 212 disposed between a polarized upper glass substrate 214 and a polarized lower glass substrate 216. The upper glass substrate 214 may have columnar indium-tin oxide (or "ITO") conductive circuits, while the lower glass substrate 216 may have horizontal ITO conductive circuits (or vice-versa). A driver integrated circuit (or "driver IC") 218 connects between the lower glass substrate 216 and a printed circuit board assembly 220. The driver IC 218 is fabricated on a flexible printed circuit (or "FPC") 222. The flexible printed circuit 222 has an unconventional, gradient shape 224. For simplicity, FIG. 3 only illustrates the single FPC 222 having the driver IC 218. In actual practice, though, the LCD module 210 may have a columnar/row grid arrangement of many FPCs 222 and their corresponding driver ICs 218, depending on pixel resolution. The FPC 222 has a first end 226 connected, perhaps via a male/female connector, to the lower glass substrate 216. The FPC 222 has an opposite, second end 228 connected, via another male/female connector, to the printed circuit board assembly 220.

Each driver IC 218 actives a corresponding row in the grid ITO in the lower glass substrate 216. An active-matrix LCD, for example, may have many thin film transistors (or "TFTs") arranged in a matrix, such as on the lower glass substrate 216. To address a particular pixel, the printed circuit board assembly 220 sends control signals (such as voltage/current) to the driver IC 218 via the FPC 222. The control signals cause the corresponding driver IC 218 to activate its horizontal row, and the printed circuit board assembly 220 sends a charge down (or electrically grounds) the correct column. Because all of the other rows that the column intersects are turned off, only the TFT capacitor at the designated pixel receives the charge (current/voltage). The TFT capacitor is able to hold the charge until the next refresh cycle. Because the basic operation of the LCD module 210 is well-known, this disclosure will not further explain the known details.

The gradient flexible printed circuit 222 has the unconventional, gradient shape 224. The gradient flexible printed circuit 222 has a generally outer or exterior parallelogram, trapezoid, or isosceles shape along its length. The gradient FPC 222 has a minor end or base side 232 (such as the first end 226) and a generally parallel major end or base side 234 (such as the second end 228 connected to the printed circuit board assembly 220). The gradient flexible printed circuit 222 also has opposite sides 236 and 238, which may or may not be parallel and/or equal length. The minor end 232 is shorter in width (illustrated as reference numeral 235) that the width (illustrated as reference numeral 237) of the major end 234, thus creating or producing the gradient shape 224. The gradient flexible printed circuit 222 thus tapers in width between its ends 226/232 and 228/234, thus having a varying cross-sectional area along most or all of its length. The gradient FPC 222 has a region containing electronic circuits/devices (such as the driver IC 218).

The gradient flexible printed circuit 222 also has a signal routing region 240 and a bendable region 242 both having conductive copper strips/traces/conductors 243 mounted or printed on a flexible, plastic substrate. Some of the strips/traces/conductors 243 may convey signals/current/voltage from the PCBA 220 to the driver IC 218. Some of the strips/traces/conductors 243 may convey signals/current/voltage from the driver IC 218 to the ITO circuits on the glass substrates 214 and 216. Other ones of the strips/traces/conductors 243 may convey signals/current/voltage from the PCBA 220 to the ITO circuits. The minor base side 232 (such as the first end 226) defines a bonding area 244 for securing/adhering to the lower glass substrate 216 (illustrated in FIG. 3). The dimensional stack of the regions 218, 240, 242, and 244 is smaller/shorter than conventional FPCs, again improving circuitry layouts and signal performance. The smaller/shorter regional stack also permits a larger screen size and a thinner display thickness.

Figure 5:
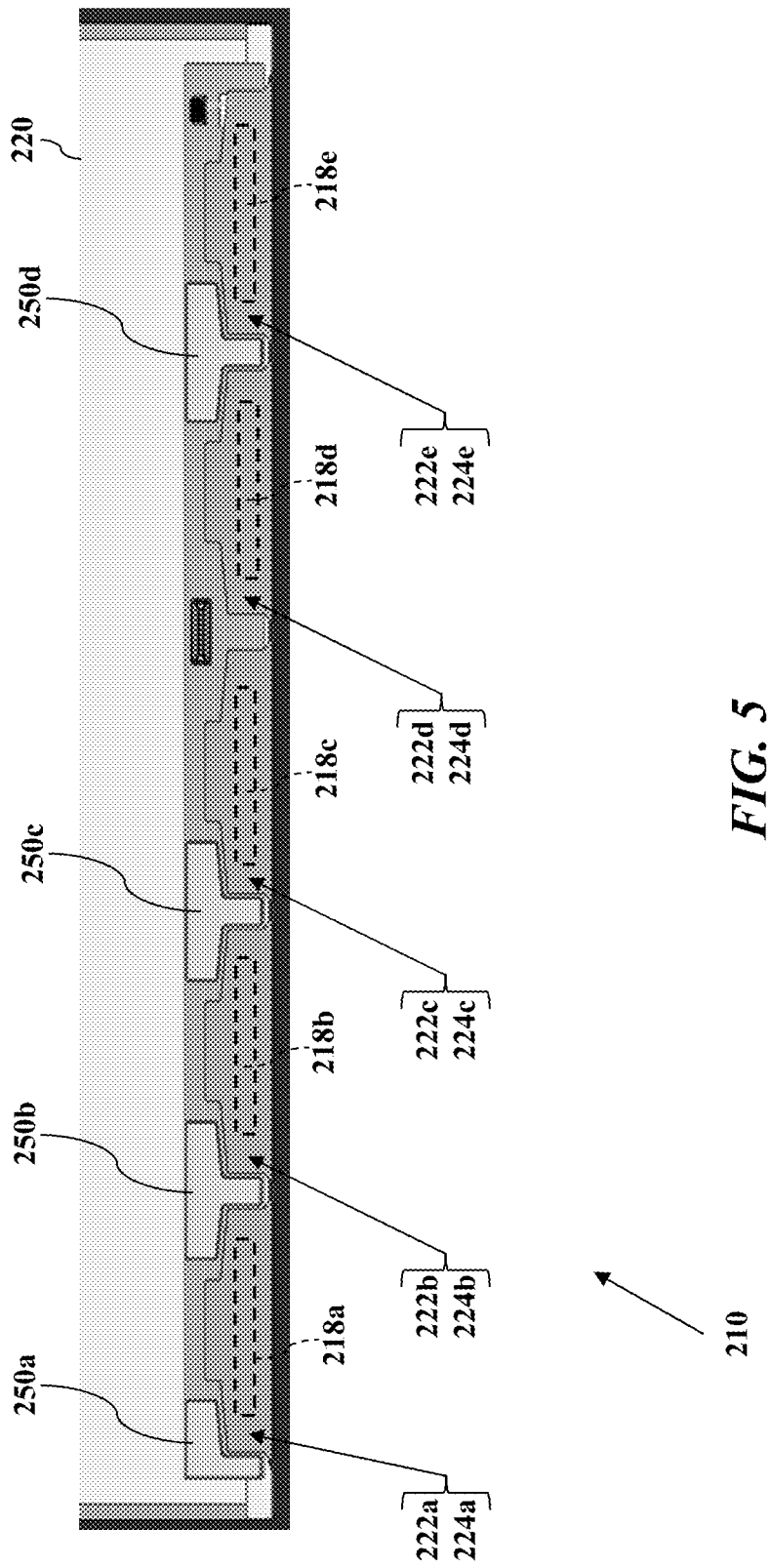
FIG. 5 illustrates improved computer functioning, according to exemplary embodiments.

FIG. 5 illustrates improved computer functioning, according to exemplary embodiments. As noted above, the LCD module 210 may have many FPCs 222 and their corresponding driver ICs 218, depending on the row/columnar grid arrangement of pixels and resolution. FIG. 5, for example, illustrates five (5) gradient flexible printed circuits 222a-e. Their corresponding gradient shapes 224a-e permits smaller component layouts, reduced component spacing, better electromagnetic shielding, and increased signal performance. A conventional flexible printed circuit has a rectangular shape having a constant cross-sectional area all along its length. The conventional flexible printed circuit unnecessarily consumes component spacing and that complicates circuit/component layouts and performance. The gradient flexible printed circuit 222, in contradistinction, allows smaller spacing between electronic components. The arrangement and layout of electronic components, in other words, may be closer together with the gradient flexible printed circuit 222, thus improving signal quality between the electronic components.

Electromagnetic shielding is also improved. FIG. 5 illustrates electromagnetic shielding cans 250a-d attenuate and stop EM wave propagation into, and outward from, the gradient flexible printed circuits 222a-e. Because the electronic components may be spaced closer together, the cans 250 may be smaller in size/volume and surface area, thus further reducing layout requirements and further improving signal quality.

Figure 6:
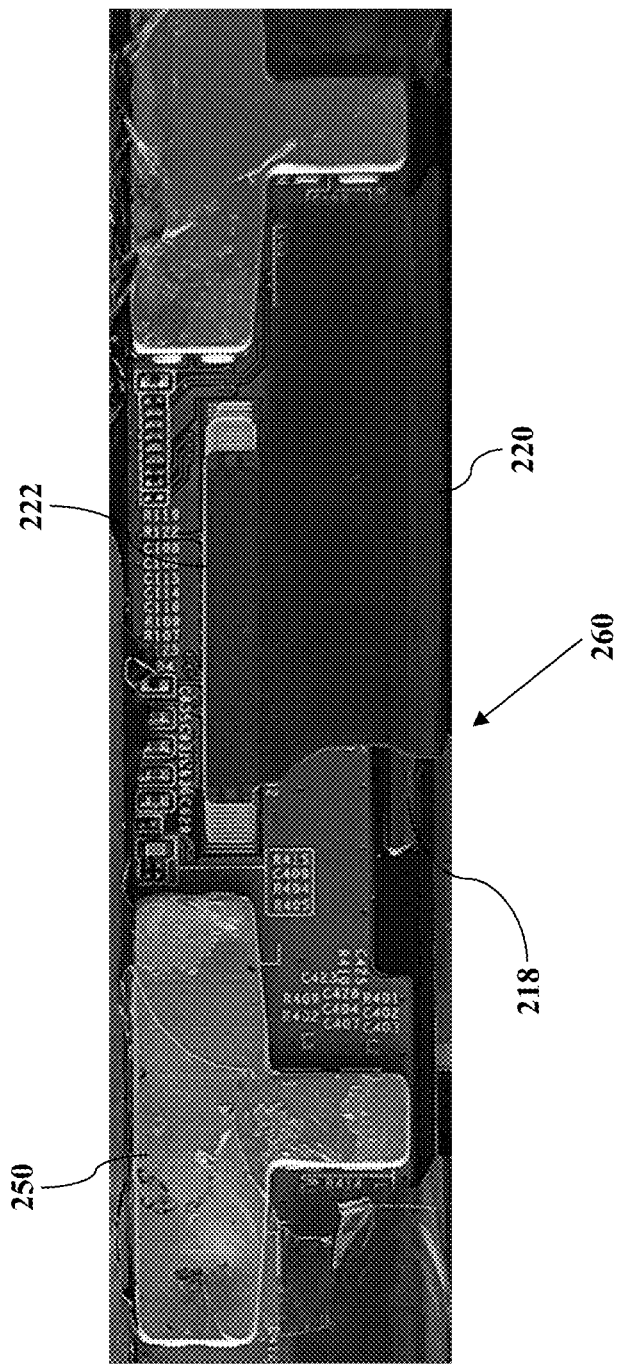
FIG. 6 illustrates PCB notching, according to exemplary embodiments.

FIG. 6 illustrates PCB notching, according to exemplary embodiments. A notch 260 may be cut, punched, or otherwise removed from the printed circuit board assembly 220. FIG. 6 illustrates the notch 260 formed in a bottom edge of the printed circuit board assembly 220. The notch 260 protects the driver IC 218 and driver IC 708 in FIGS. 7 and 8 from damage during shipment, handling, assembly, and use. The notch 260 thus helps prevent loss due to damaged driver circuitry, thus reducing panel manufacturing defects, assembly damage defects, and warranty returns. Moreover, the notch 260 further reduces the dimensional stack (illustrated in FIG. 4) about 0.5~0.6 mm, which again helps yield a thinner display module 210 and the laptop 200 (illustrated in FIG. 2).

Improved computer functioning is confirmed. Computer aided designs of the laptop computer 200 included the gradient flexible printed circuit 222 and moved the bonding area 244 (illustrated in FIG. 4) to an opposite side of printed circuit board assembly 220. These CAD designs optimized the dimension of the bonding area 244 and also optimized the signal routing region 240. These CAD designs reduced the y-axis dimension of the printed circuit board assembly 220 around 35~40%.

Exemplary embodiments thus present elegant solutions. The gradient flexible printed circuit 222 provides reduced circuitry layouts, improved signal characteristics, larger display areas, thinner displays, reduced defects/damage, and greater customer satisfaction. The gradient flexible printed circuit 222 thus presents elegant options that improve computer functioning of displaying image outputs.

Figure 7:
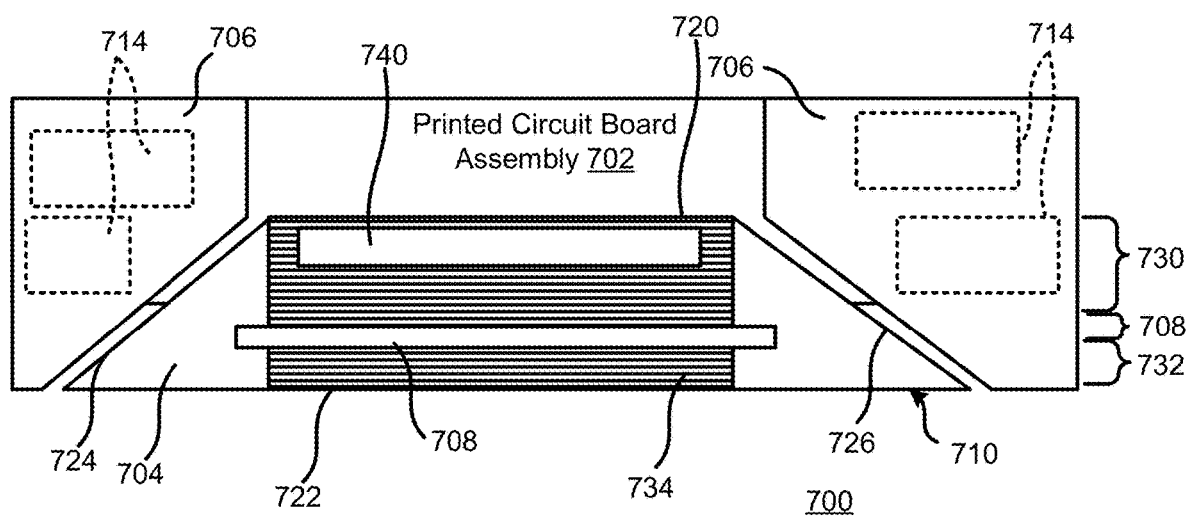
FIG. 7 is an enlarged view of a polygon flexible printed circuit, according to exemplary embodiments.

FIG. 7 illustrates an enlarged view of a portion 700 of an information handling system, such as information handling system 100 of FIG. 1, according to exemplary embodiments. Portion 700 of the information handling system includes a printed circuit board assembly 702, a polygon flexible printed circuit 704, shielding cans 706, and a driver IC 708. Polygon flexible printed circuit 704 has the unconventional, polygon shape 710. Polygon flexible printed circuit 704 has a generally outer or exterior parallelogram, trapezoid, or similar shape along its length. Polygon FPC 704 has a minor end or base side 720, such as the first end 226 of FIG. 3, and a generally parallel major end or base side 722, such as the second end 228 connected to the printed circuit board assembly 220 of FIG. 3. Polygon flexible printed circuit 704 also has opposite sides 724 and 726, which may or may not be equal length. The minor end 720 is shorter in width than the width of the major end 722, thus creating or producing the polygon shape 710. Polygon flexible printed circuit 704 thus tapers in width between its ends 722 and 720, thus having a varying cross-sectional area along most or all of its length. Polygon FPC 704 has a region containing electronic circuits/devices, such as the driver IC 708.

Polygon flexible printed circuit 704 also has a signal routing region 730 and a bendable region 732 both having conductive copper strips/traces/conductors 734 mounted or printed on a flexible, plastic substrate. Some of the strips/traces/conductors 734 may convey signals/current/voltage from PCBA 702 to driver IC 708. Some of the strips/traces/conductors 734 may convey signals/current/voltage from driver IC 708 to ITO circuits on the glass substrates 214 and 216 of FIG. 3. Other ones of the strips/traces/conductors 734 may convey signals/current/voltage from PCBA 702 to the ITO circuits. Minor base side 720 defines a bonding area 740 for securing/adhering to the lower glass substrate 216 (illustrated in FIG. 3). In an example, bonding pad 740 may be secured to lower glass substrate 216 on a top side of PCBA 702. The dimensional stack of regions 708, 730, and 732 is smaller/shorter than conventional FPCs, again improving circuitry layouts and signal performance. The smaller/shorter regional stack also permits a larger screen size and a thinner display thickness.

In an example, PCBA 702 may include multiple circuitry components 714, which in turn may be covered by shielding cans 706. In certain examples, shielding cans 706 may reduce noise, cross-talk and other electro-magnetic interference between PCBA 702 and polygon FPC 704. Shielding cans 706 may have an unconventional polygon shape. Each shielding can 706 may have a generally outer or exterior parallelogram, trapezoid, or similar shape along its length. Each shielding can 706 may have a top edge and a generally parallel bottom edge. Each shielding can 706 may also have opposite sides, which may or may not be equal length. The bottom edge may be shorter in width than the top edge, thus creating or producing a polygon shape. Each shielding can 706 thus tapers in width between its top and bottom edges, thus having a varying cross-sectional area along most or all of its length.

Figure 8:
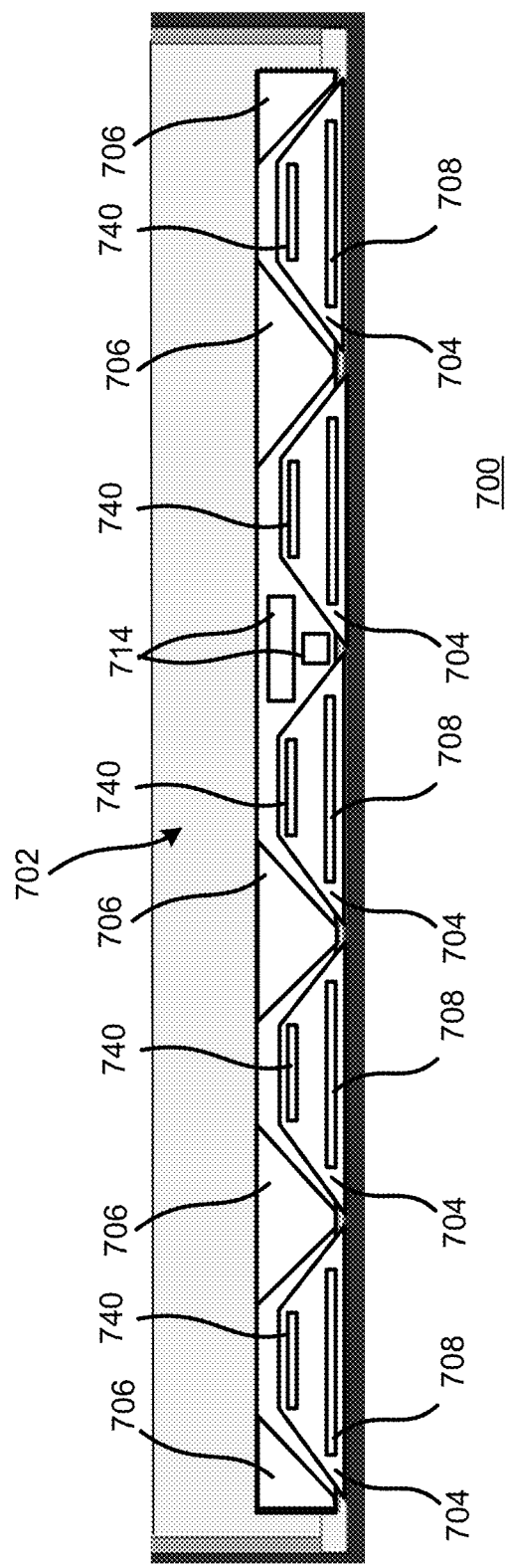
FIG. 8 illustrates improved computer functioning, according to exemplary embodiments.

FIG. 8 illustrates improved computer functioning, according to exemplary embodiments. As noted above, the LCD module 210 may have many FPCs 704 and their corresponding driver ICs 708, depending on the row/columnar grid arrangement of pixels and resolution. FIG. 8, for example, illustrates five (5) polygon flexible printed circuits 704. Their corresponding polygon shapes 710 permits smaller component layouts, reduced component spacing, better electromagnetic shielding, and increased signal performance. A conventional flexible printed circuit has a rectangular shape having a constant cross-sectional area all along its length. The conventional flexible printed circuit unnecessarily consumes component spacing and that complicates circuit/component layouts and performance. Polygon flexible printed circuit 704, in contradistinction, allows smaller spacing between electronic components. The arrangement and layout of electronic components, in other words, may be closer together with polygon flexible printed circuit 704, thus improving signal quality between the electronic components.

Electromagnetic shielding is also improved. FIG. 8 illustrates electromagnetic shielding cans 706 attenuate and stop EM wave propagation into, and outward from, the polygon flexible printed circuits 704. Because the electronic components may be spaced closer together, shielding cans 706 may be smaller in size/volume and surface area, thus further reducing layout requirements and further improving signal quality. Polygon shape 710 of polygon flexible printed circuit 704 may enable more circuitry components 714 to be placed on PCBA 702. For example, circuitry components 714 may be located further toward major end or base side 722 of polygon flexible printed circuit 704 as compared to conventional flexible printed circuits.

Exemplary embodiments thus present elegant solutions. The polygon flexible printed circuit 704 provides reduced circuitry layouts, improved signal characteristics, larger display areas, thinner displays, reduced defects/damage, and greater customer satisfaction. The polygon flexible printed circuit 704 thus presents elegant options that improve computer functioning of displaying image outputs. The optimized the dimension of bonding area 712 and also optimized the signal routing region may reduced they-axis dimension of printed circuit board assembly 702 around 35~40% over conventional printed circuit board assemblies.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A liquid crystal display (LCD) module, comprising:
a liquid crystal material sandwiched between glass substrates;
a printed circuit board assembly;
first and second polygon flexible printed circuits, the first polygon flexible printed circuit including a driver integrated circuit, the first polygon flexible printed circuit having a minor end connected to one of the glass substrates and a major end connected to the printed circuit board assembly; and
a shielding can in physical communication with the printed circuit board assembly, the shielding can including a minor end and a major end, wherein the minor end of the shielding can is located in between the major end of both of the first and second polygon flexible printed circuits and the major end of the shielding can is located in between the minor ends of both of the first and second polygon flexible printed circuits, the shielding can to reduce electromagnetic interference between the printed circuit board and the first polygon flexible printed circuit, wherein the shielding can covers multiple circuitry components of the printed circuit board assembly;

wherein the printed circuit board assembly controls the driver integrated circuit via the first polygon flexible printed circuit.

2. The LCD module of claim 1, wherein the minor end of the first polygon flexible printed circuit has a shorter width than the major end.

3. The LCD module of claim 1, wherein the first polygon flexible printed circuit comprises a signal routing region connected to the printed circuit board assembly.

4. The LCD module of claim 1, wherein the first polygon flexible printed circuit comprises a signal routing region connected to the driver integrated circuit.

5. The LCD module of claim 1, wherein the first polygon flexible printed circuit comprises a conductive trace connected from the printed circuit board assembly to the driver integrated circuit.

6. The LCD module of claim 1, wherein the printed circuit board assembly includes a notch structure to accommodate the driver integrated circuit of the first polygon flexible printed circuit.

7. The LCD module of claim 1, wherein the first polygon flexible printed circuit has a bonding region along the minor end.

8. The LCD module of claim 1, wherein the minor end of the first polygon flexible printed circuit is bonded to one of the glass substrates.

9. An information handling system, comprising:
a processor; and
a liquid crystal display (LCD) module interfacing with the hardware processor, the LCD module including:
  a liquid crystal material disposed between glass substrates;
  a printed circuit board assembly;
  first and second polygon flexible printed circuits, the first polygon flexible printed circuit including a driver integrated circuit, the first polygon flexible printed circuit having a minor end connected to one of the glass substrates and a major end connected to the printed circuit board assembly; and
  a shielding can in physical communication with the printed circuit board assembly, the shielding can including a minor end and a major end, wherein the minor end of the shielding can is located in between the major end of both of the first and second polygon flexible printed circuits and the major end of the shielding can is located in between the minor ends of both of the first and second polygon flexible printed circuits, the shielding can to reduce electromagnetic interference between the printed circuit board and the first polygon flexible printed circuit, wherein the shielding can covers multiple circuitry components of the printed circuit board assembly;
  wherein the printed circuit board assembly controls the driver integrated circuit via the first polygon flexible printed circuit.

10. The information handling system of claim 9, wherein the minor end of the first polygon flexible printed circuit has a shorter width than the major end.

11. The information handling system of claim 9, wherein the printed circuit board assembly includes a notch structure to accommodate the driver integrated circuit of the first polygon flexible printed circuit.

12. The information handling system of claim 9, wherein the first polygon flexible printed circuit comprises a signal routing region connected to the driver integrated circuit.

13. The information handling system of claim 9, wherein the first polygon flexible printed circuit comprises a conductive trace connected from the printed circuit board assembly to the driver integrated circuit.

14. The information handling system of claim 9, wherein the first polygon flexible printed circuit has a generally trapezoidal exterior shape.

15. The information handling system of claim 9, wherein the first polygon flexible printed circuit has a bonding region along the minor end.

16. The information handling system of claim 9, wherein the minor end of the first polygon flexible printed circuit is bonded to one of the glass substrates.

17. An information handling system, comprising:
a processor; and
a liquid crystal display (LCD) module interfacing with the hardware processor, the LCD module including:
  a liquid crystal material disposed between glass substrates;
  a printed circuit board assembly;
  first and second polygon flexible printed circuits, the first polygon flexible printed circuit including a driver integrated circuit, the first polygon flexible printed circuit having a minor end connected to one of the glass substrates and a major end connected to the printed circuit board assembly; and
  a shielding can in physical communication with the printed circuit board assembly, the shielding can including a minor end and a major end, wherein the minor end of the shielding can is located in between the major end of both of the first and second polygon flexible printed circuits and the major end of the shielding can is located in between the minor ends of both of the first and second polygon flexible printed circuits, the shielding can to reduce electromagnetic interference between the printed circuit board and the first polygon flexible printed circuit, wherein the shielding can covers multiple circuitry components of the printed circuit board assembly;
  wherein the printed circuit board assembly controls the driver integrated circuit via the first polygon flexible printed circuit;
  wherein the minor end of the first polygon flexible printed circuit has a shorter width than the major end; and
  wherein the first polygon flexible printed circuit comprises a signal routing region connected to the printed circuit board assembly.

18. The information handling system of claim 17, wherein the first polygon flexible printed circuit comprises a signal routing region connected to the driver integrated circuit.

19. The information handling system of claim 17, wherein the printed circuit board assembly includes a notch structure to accommodate the driver integrated circuit of the first polygon flexible printed circuit.

20. The information handling system of claim 17, wherein the first polygon flexible printed circuit has a generally trapezoidal exterior shape.

* * * * *